(12) United States Patent
Sforzin et al.

(10) Patent No.: US 12,354,653 B2
(45) Date of Patent: Jul. 8, 2025

(54) DRIFT COMPENSATION FOR CODEWORDS IN MEMORY

(71) Applicant: Micron Technology, Inc., Boise, ID (US)

(72) Inventors: Marco Sforzin, Cernusco Sul Naviglio (IT); Paolo Amato, Treviglio (IT); Luca Barletta, Gallarate (IT); Marco Pietro Ferrari, Milan (IT); Antonino Favano, Brolo (IT)

(73) Assignee: Micron Technology, Inc., Boise, ID (US)

( * ) Notice: Subject to any disclaimer, the term of this patent is extended or adjusted under 35 U.S.C. 154(b) by 483 days.

(21) Appl. No.: 17/948,520

(22) Filed: Sep. 20, 2022

(65) Prior Publication Data

US 2024/0071486 A1    Feb. 29, 2024

Related U.S. Application Data

(60) Provisional application No. 63/402,329, filed on Aug. 30, 2022.

(51) Int. Cl.
*G11C 11/56* (2006.01)
*G11C 5/14* (2006.01)

(52) U.S. Cl.
CPC .......... *G11C 11/5642* (2013.01); *G11C 5/147* (2013.01); *G11C 11/5628* (2013.01)

(58) Field of Classification Search
CPC . G11C 11/5642; G11C 5/147; G11C 11/5628; G11C 29/021; G11C 29/028;
(Continued)

(56) References Cited

U.S. PATENT DOCUMENTS

| 10,431,301 | B2 | 10/2019 | Mirichigni et al. |
| 10,566,052 | B2 | 2/2020 | Mirichigni et al. |

(Continued)

OTHER PUBLICATIONS

Bu Renfei, et al., "Minimum Pearson Distance Detection Using a Difference Operator in the Presence of Unknown Varying Offset", IEEE Communications Letters, IEEE Service Center, Piscataway, NJ, USA, vol. 23, No. 7, Jul. 1, 2019, 4 pages.

(Continued)

*Primary Examiner* — Donald H B Braswell
(74) *Attorney, Agent, or Firm* — Brooks, Cameron & Huebsch, PLLC (57) ABSTRACT

The present disclosure includes apparatuses, methods, and systems for drift compensation for codewords in memory. An embodiment includes a memory device having an array of memory cells, and circuitry to sense a codeword stored in the array, determine a derivative value of a cell metric for each cell of the codeword based on a threshold voltage of that respective cell, a mean of threshold voltage values of each cell of the codeword, and a value proportional to a total quantity of the cells of the codeword and a position of the threshold voltage value of that respective cell in the threshold voltage values of each cell of the codeword, determine the cell metric for which the determined derivative value changes from a first polarity to a second polarity, input the determined cell metric to a Pearson detector, and determine originally programmed data of the codeword using the Pearson detector.

25 Claims, 5 Drawing Sheets

(58) Field of Classification Search
CPC ..... G11C 16/26; G11C 16/3413; G11C 16/12; G11C 16/3459
See application file for complete search history.

(56) References Cited

U.S. PATENT DOCUMENTS

| | | |
|---|---|---|
| 10,714,185 B2 | 7/2020 | Sforzin et al. |
| 10,976,936 B2 | 4/2021 | Sforzin et al. |
| 11,164,619 B2 | 11/2021 | Sforzin et al. |
| 2016/0180959 A1* | 6/2016 | Darragh ................. G11C 16/12 365/185.09 |

OTHER PUBLICATIONS

Schouhamer Immink Kees, et al., "Minimum Pearson Distance Detection Using Mass-Centered Codewords in the Presence of Unknown Varying Offset", IEEE Journal on Selected Areas in Communications, IEEE Service Center, Piscataway, NJ, USA, vol. 34, No. 9, Sep. 1, 2016, 8 pages.

Schouhamer Immink, et al., "Minimum Pearson Distance Detection for Multilevel Channels With Gain and/or Offset Mismatch", IEEE Transactions on Information Theory, issue 10, vol. 60, Oct. 2014, pp. 5966-5974.

Schouhamer Immink, et al., "Dynamic Threshold Detection Based on Pearson Distance Detection", IEEE Transactions on Communications, issue 7, vol. 66, Jul. 2018, pp. 2958-2965.

* cited by examiner

DRIFT COMPENSATION FOR CODEWORDS IN MEMORY

PRIORITY INFORMATION

This application claims the benefit of U.S. Provisional Application Ser. No. 63/402,329 filed on Aug. 30, 2022, the contents of which are incorporated herein by reference.

TECHNICAL FIELD

The present disclosure relates generally to semiconductor memory and methods, and more particularly, to drift compensation for codewords in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MHLCs). MHLCs can provide higher density memories without increasing the number of memory cells since each cell can represent more than one digit (e.g., more than one bit).

DETAILED DESCRIPTION

The present disclosure includes apparatuses, methods, and systems for drift compensation for codewords in memory. An embodiment includes a memory device having an array of memory cells, and circuitry to sense a codeword stored in the array, determine a derivative value of a cell metric for each cell of the codeword based on a threshold voltage of that respective cell, a mean of threshold voltage values of each cell of the codeword, and a value proportional to a total quantity of the cells of the codeword and a position of the threshold voltage value of that respective cell in the threshold voltage values of each cell of the codeword, determine the cell metric for which the determined derivative value changes from a first polarity to a second polarity, input the determined cell metric to a Pearson detector, and determine originally programmed data of the codeword using the Pearson detector.

A memory device can address memory cells for operations (e.g., sense and program operations) in groups (e.g., packets) called words or codewords. As memory cells are sensed and programmed, their response to positive or negative electrical pulses can change cycle after cycle (e.g., according to a specific electrical bias history of the code/word to which they belong).

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to a reference signal, which may be, for instance, a reference voltage. The reference voltage may correspond to a voltage positioned between an expected voltage level of the signal output by a memory cell programmed to a first data state (e.g., storing a first logic value) and an expected voltage level of the signal output by a memory cell programmed to a second data state (e.g., storing a second logic value). For instance, the sense circuitry may determine that the memory cell has been programmed to a first data state if the signal output by the memory cell is less than the reference voltage, and that the memory cell has been programmed to a second data state if the signal output by the memory cell is greater than the reference voltage.

If, however, the memory cell experiences threshold voltage drift, the threshold voltage of the memory cell may change such that the signal output by the memory cell during a sense operation does not correspond to the data state to which the memory cell was programmed (e.g., is no longer the expected value of a signal output by a memory cell programmed to that data state). As used herein, "drift" refers to a difference between the programmed threshold voltage of a memory cell and the sensed threshold voltage of the memory cell. Threshold voltage drift can occur in a memory cell after multiple operations (e.g., multiple read cycles) are performed on the memory cell and/or due to temperature variations in the memory cell, for instance. Threshold voltage drift can lead to an incorrect read in a memory cell. For instance, threshold voltage drift may result in the memory cells of a codeword being sensed to be in states to which they were not actually programmed (e.g., a cell programmed to be in the first data state may be erroneously sensed to be in the second data state, and/or vice versa). Such erroneous data sensing can reduce the performance and/or lifetime of the memory.

Embodiments of the present disclosure, however, can compensate for threshold voltage drift that may occur in the memory cells of a codeword, such that the data states of the memory cells of the codeword can be accurately determined. For example, embodiments of the present disclosure can use a Pearson detector to determine the originally programmed data of a codeword whose memory cells have been affected by threshold voltage drift. Accordingly, embodiments of the present disclosure can increase the performance and/or lifetime of memory that utilizes codewords (e.g., by estimating the original value of the data bits in a codeword that has been affected by threshold voltage drift).

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designator "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1A:
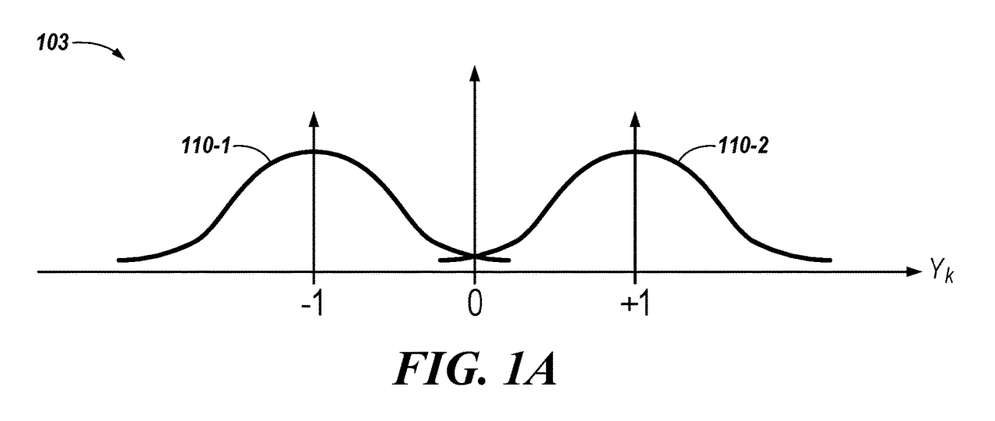
FIGS. 1A and 1B illustrate diagrams of a number of threshold voltage distributions, sensing voltages, and data assignments associated with a group of memory cells in accordance with an embodiment of the present disclosure.
Figure 1B:
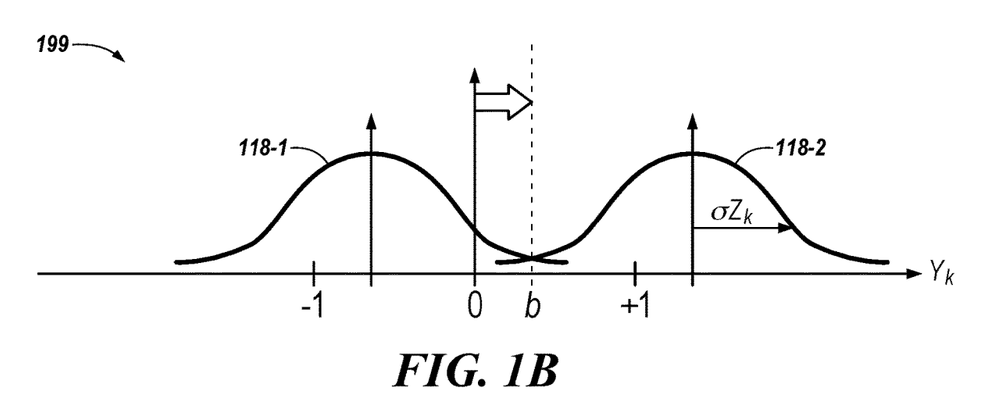

FIGS. 1A and 1B illustrate diagrams of a number of threshold voltage (Vt) distributions, sensing voltages, and data assignments associated with a group of memory cells in accordance with an embodiment of the present disclosure. The group of memory cells can be, for example, a codeword, which can refer to a logical unit of a memory device used to store data. FIG. 1A illustrates a diagram 103 of Vt distributions 110-1 and 110-2 associated with the data states of the memory cells of a codeword before the memory cells of the codeword have experienced threshold voltage drift, and FIG. 1B illustrates a diagram 199 of Vt distributions 118-1 and 118-2 associated with codeword after the memory cells of the codeword have experienced threshold voltage drift.

As an example, the two Vt distributions 110-1 and 110-2 shown in FIG. 1A, and the two Vt distributions 118-1 and 118-2 shown in FIG. 1B, can correspond to single level (e.g., two-state) memory cells. However, embodiments of the present disclosure are not limited to single level memory cells. For example, embodiments of the present disclosure can include multilevel cells such as, for instance, triple level cells (TLCs), or quadruple level cells (QLCs). In such examples, the diagrams illustrated in FIGS. 1A and 1B would include additional Vt distributions (e.g., corresponding to each of the additional data states).

Vt distributions 110-1 and 110-2 shown in FIG. 1A, and Vt distributions 118-1 and 118-2 shown in FIG. 1B, represent two target data states (e.g., 1 and 0, respectively, which are represented in FIGS. 1A and 1B by −1 and 1, respectively) to which the memory cells of the group can be programmed. Embodiments of the present disclosure, however, are not limited to these data assignments.

Vt distributions 110-1 and 110-2 shown in FIG. 1A, and Vt distributions 118-1 and 118-2 shown in FIG. 1B, can represent a quantity (e.g., number) of memory cells of the group that are programmed to the corresponding target states (e.g., 1 and 0), with the height of a Vt distribution curve indicating the quantity of cells programmed to a particular voltage within the Vt distribution (e.g., on average). The width of the Vt distribution curve indicates the range of voltages that represent a particular target state (e.g., the width of the Vt distribution curves 110-2 and 118-2 represent the range of voltages that correspond to a data value of 0 for the original codeword (e.g. before the codeword has experienced threshold voltage drift) and the codeword after it has experienced threshold voltage drift, respectively). In the example illustrated in FIG. 1A (e.g., the original codeword), the widths and heights of Vt distributions 110-1 and 110-2 are equivalent (e.g., equal). Further, in the example illustrated in FIG. 1B (e.g., the codeword that has experienced drift), the widths and heights of Vt distributions 118-1 and 118-2 are equivalent.

During a sense (e.g., read) operation to determine the respective data states stored by the memory cells of the group, a reference voltage located between the two Vt distributions (e.g., at location 0 illustrated in FIG. 1A) can be used to distinguish between the two data states (e.g., between states 1 and 0). For example, during a sense operation performed on a selected memory cell of the group, a sense voltage can be applied to first signal line (e.g., an access line) to which the memory cell is coupled, and the resulting voltage signal (e.g. in response to the sense voltage being applied to the access line) from the memory cell can be provided to sense circuitry via a second signal line (e.g., a sense line) to which the memory cell is coupled for comparison with the reference voltage. The data state for the selected memory cell can be determined using (e.g., by comparing) the voltage signal from that memory cell and the reference voltage.

In the examples illustrated in FIGS. 1A and 1, the reference voltage used to distinguish between the two data states can be determined by averaging the threshold voltages of the memory cells of the group (e.g., codeword). For the original codeword (e.g., whose cells have not experienced threshold voltage drift), this reference voltage would be located exactly between its Vt distributions 110-1 and 110-2 at 0, as illustrated in FIG. 1A. However, for the codeword whose memory cells have experienced drift, this reference voltage would be located exactly between its Vt distributions 118-1 and 118-2 at b instead of 0, which is illustrated in FIG. 1B. As such, using 0 as the reference voltage to sense the data states of the memory cells of the codeword that has experienced drift may result in some cells of that codeword being sensed to be in a state to which they were not actually programmed to. For instance, a cell programmed to a target state of 1, but whose voltage is to the right of 0 (e.g., the reference voltage in FIG. 1A) within distribution 118-1, may be erroneously sensed to be in state 0.

Embodiments of the present disclosure, however, can compensate for this threshold voltage drift by determining (e.g., estimating) the original (e.g., expected) data bits of a codeword that has experienced threshold voltage drift. Estimating the originally programmed data of the codeword can reduce the likelihood of the data states of the memory cells in the codeword being read incorrectly when the memory cells have experienced threshold voltage drift.

Figure 2:
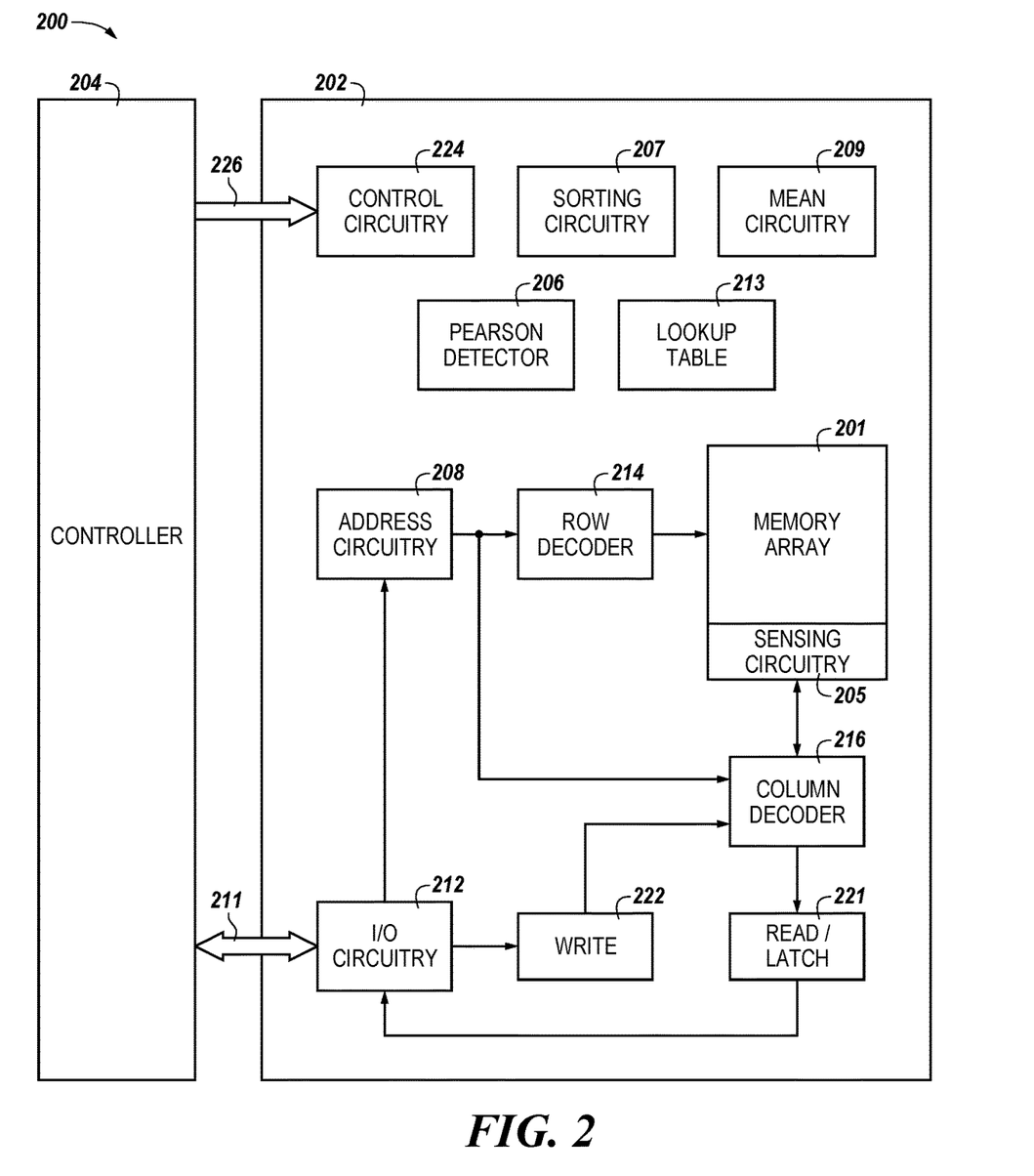
FIG. 2 is a block diagram illustration of an example apparatus in accordance with an embodiment of the present disclosure.

FIG. 2 is a block diagram illustration of an example apparatus, such as an electronic memory system 200, in accordance with an embodiment of the present disclosure. Memory system 200 may include an apparatus, such as a memory device 202 and a controller 204, such as a memory controller (e.g., a host controller). Controller 204 might include a processor, for example. Controller 204 might be coupled to a host, for example, and may receive command signals (or commands), address signals (or addresses), and data signals (or data) from the host and may output data to the host.

Memory device 202 includes a memory array 201 of memory cells. For example, memory array 201 can include a group of memory cells, such as a codeword, as previously described herein (e.g., in connection with FIGS. 1A-1B). Memory array 201 can be, for example, a DRAM array, such as, for instance, a ferroelectric memory (e.g., FeRAM) array. That is, the memory cells of array 201 can be DRAM (e.g., FeRAM) cells. However, embodiments are not limited to a particular type of memory array. For instance, in some embodiments (e.g., embodiments in which non-destructive read operations are performed on the memory cells of array 201), memory array 201 can be a NAND flash array (e.g., the memory cells of array 201 can be NAND flash memory cells). As an additional example, in some embodiments (e.g., embodiments in which destructive read operations are performed on the memory cells of array 201), memory array 201 can be a self-selecting memory array (e.g., the memory cells of array 201 can comprise a single material that serves as both a select element and a storage element). Further, although one memory array 201 is illustrated in FIG. 2 for simplicity and so as not to obscure embodiments of the present disclosure, memory device 202 can include a number of memory arrays analogous to array 201.

Memory device 202 may include address circuitry 208 to latch address signals provided over I/O connections 211 through I/O circuitry 212. Address signals may be received and decoded by a row decoder 214 and a column decoder 216 to access the memory array 201. For example, row decoder 214 and/or column decoder 216 may include drivers.

Controller 204 may sense (e.g., read) data in memory array 201, such as a codeword stored in array 201, by using read/latch circuitry 221 and/or sensing circuitry 205. Read/latch circuitry 221 may read and latch data from the memory array 201. Sensing circuitry 205 may include a number of sense amplifiers coupled to memory cells of memory array 201, which may operate in combination with the read/latch circuitry 221 to sense (e.g., read) memory states from targeted memory cells. I/O circuitry 212 may be included for bi-directional data communication over the I/O connections 211 with controller 204. Write circuitry 222 may be included to program (e.g., write) data to memory array 201.

Control circuitry 224 may decode signals provided by control connections 226 from controller 204. These signals may include chip signals, write enable signals, and address latch signals that are used to control the operations on memory array 201, including data read and data write operations. Control circuitry 224 may be included in controller 204, for example. Controller 204 may include other circuitry, firmware, software, or the like, whether alone or in combination. Controller 204 may be an external controller (e.g., in a separate die from the memory array 201, whether wholly or in part) or an internal controller (e.g., included in a same die as the memory array 201). For example, an internal controller might be a state machine or a memory sequencer.

The memory device 202 can also include circuitry configured to determine (e.g., estimate) the originally programmed data of a codeword (e.g., a sensed codeword) that has experienced threshold voltage drift. For example, the memory device 202 can include sorting circuitry 207, mean circuitry 209, a Pearson detector 206, and look up table 213. The sorting circuitry 207 can sort the data bits (e.g., the threshold voltage values of the memory cells) of the codeword into different voltage distributions, the mean circuitry 209 can determine a mean threshold voltage value of the memory cells corresponding to the data bits in the codeword, the look up table 213 can be used to determine a value proportional to the total quantity of memory cells of the codeword and the respective positions of the threshold voltage values of the memory cells in the sorted threshold voltage values, and Pearson detector 206 can determine the originally programmed data of the codeword (e.g., the value of the data bits in the originally programmed codeword). In some embodiments, the sorting circuitry 207, mean circuitry 209, Pearson detector 206, and look up table 213 can be included in (e.g., located on) a controller (e.g., controller 204) instead of the memory device 202. Mean circuitry 209 will be further described herein (e.g., in connection with FIG. 5).

Determining the originally programmed data of a codeword includes inputting a cell metric determined to have a derivative value (e.g., a first derivative value) that changes from a first (e.g., negative) polarity to a second (e.g., positive) polarity into the Pearson detector 206. For instance, the derivative value of the cell metric for each memory cell of the codeword can be determined, and the cell metric for which the derivative value changes from a negative value to a positive value can be input to the Pearson detector 206 to determine the originally programmed data of the codeword. As used herein, the term "cell metric" refers to a value associated with a memory cell that can be input into a Pearson detector. An example of such cell metrics, and derivative values of the cell metrics, will be further described herein (e.g., in connection with FIG. 3).

In some embodiments, the cell metric input to the Pearson detector 206 can comprise a Pearson distance between the derivative value of the determined cell metric and a correlation between the originally programmed data of the codeword and the sensed codeword. For instance, the value of the cell metric whose derivative value changes from negative to positive and a correlation between a tentative codeword and the sensed codeword can be input into the Pearson detector to determine the originally programmed data of the codeword. As used herein, the term "tentative codeword" refers to a codeword that provides the lowest Pearson distance between the sensed codeword and the originally programmed codeword relative to the other codewords in the memory array 201. The sensed codeword can comprise a sensed data value for each memory cell of the sensed codeword. The originally programmed data of the codeword can include the programmed data value for each memory cells of the codeword (e.g., corresponding to the data bits in the originally programmed codeword).

The Pearson detector 206 can determine the originally programmed data of the codeword by searching for a codeword (e.g., a sensed codeword) that has a lowest Pearson distance from the original codeword relative to other codewords (e.g., other sensed codewords). As used herein, the term "Pearson distance" refers to a measure of the linear correlation between two sets of data (e.g. between two codewords). The Pearson detector can use the sensed codeword that has the lowest Pearson distance from the original codeword to estimate the value of each data bit of the original codeword. In some embodiments, the Pearson detector can determine the lowest Pearson distance using a weight estimator. The weight estimator can be the estimated weight of the original codeword. As used herein, the term "weight" refers to the number of data bits with a particular data value (e.g., the number bits with a value of 1) in a codeword.

The derivative value of the cell metric for each memory cell of the codeword can be determined based on the threshold voltage value of that memory cell, the mean of the threshold voltage values of the memory cells of the codeword, and a value that is proportional to the total quantity of memory cells of the codeword and the position of the threshold voltage value of that memory cell in the sorted threshold voltage values. For example, the derivative value of the cell metric for each memory cell (e.g., each data bit) of the sensed codeword can be given by the following equation:

$$D_w(Y) = Y_{w:N} - \mu_y + ((N+1-2w)/N)$$

In the foregoing equation, the derivative value of the cell metric for each respective memory cell is represented by the symbol $D_w(Y)$. The equation states that the derivative value of the cell metric for a memory cell can be determined by subtracting the mean of the threshold voltage values of the memory cells of the codeword, represented in the foregoing equation as $\mu_y$, from the threshold voltage value of that memory cell, represented in the foregoing equation as $Y_{w:N}$, and then adding the value given by $(N+1-2w)/N$, where N is the total quantity of memory cells of the codeword and w is the position of the threshold voltage value of that memory cell in the sorted threshold voltage values (e.g., the position of the threshold voltage value of the memory cell corresponding to the data bit in the sorted threshold voltage values). In some embodiments, the value that is proportional to the total quantity of memory cells of the codeword and the position of the threshold voltage value of that memory cell in the sorted threshold voltage values (e.g., the value given by $(N+1-2w)/N$ can be determined using (e.g., accessed from) look up table 213. Further, the derivative value of the cell metric for each memory cell of the sensed codeword can correspond to the difference between the cell metric for that memory cell and the cell metric for the memory cell whose threshold voltage value's position immediately precedes the position of the threshold voltage value of that memory cell in the sorted threshold voltage value sequence. An example of such cell metrics, and derivative values of the cell metrics, will be further described herein (e.g., in connection with FIG. 3). Further, the process for sorting the threshold voltage values of the memory cells of the sensed codeword in ascending order (e.g., based on the threshold voltage value of the corresponding memory cell) is described in connection with FIG. 4 and the process for determining the mean of the sorted threshold voltage values is described in connection with FIG. 5.

In some embodiments, the mean of the threshold voltage values of the memory cells of the codeword can be determined (e.g., computed) by performing a first sense (e.g., read) operation, and a second (e.g., separate) sense operation can then be subsequently performed to determine (e.g., compute) the derivative value of the cell metric for each memory cell of the codeword using the determined mean. Such embodiments can include, for instance, embodiments in which the memory cells of memory array 201 are sensed via non-destructive sense operations (e.g., embodiments in which memory array 201 is a NAND flash array). The first and second sense operations can be the same type of sense operation (e.g., performed using the same methodology), or different types of sense operations (e.g., performed using different methodologies).

In some embodiments, the derivative value of the cell metric for each memory cell of the codeword can be determined by performing a single (e.g., only one) sense operation. For instance, a single sense operation can be performed to determine the threshold voltage values of the memory cells of the codeword, and these determined threshold voltage values can then be subsequently used (e.g. processed) to determine the mean of the threshold voltage values, and then finally the derivative values can be determined (e.g., computed). Such embodiments can include, for instance, embodiments in which the memory cells of memory array 201 are sensed via destructive sense operations (e.g., embodiments in which memory array 201 is a self-selecting array). In such embodiments, once the original codeword has been determined, the original codeword (e.g., the data of the originally programmed codeword) can be programmed (e.g., written back) to memory array 201.

The number of data bits in the codeword having a value of 0 can be different than the number of data bits in that same codeword that have a value of 1. In some embodiments, a data bit that has a first value can be added to the codeword if the sensed codeword only comprises data bits having a second value. For example, if the codeword only comprises data bits having a value of 1, a data bit with a value of 0 can be added to the codeword. Alternatively, if the codeword only comprises data bits having a value of 0, a data bit with a value of 1 can be added to the codeword.

Figure 3:
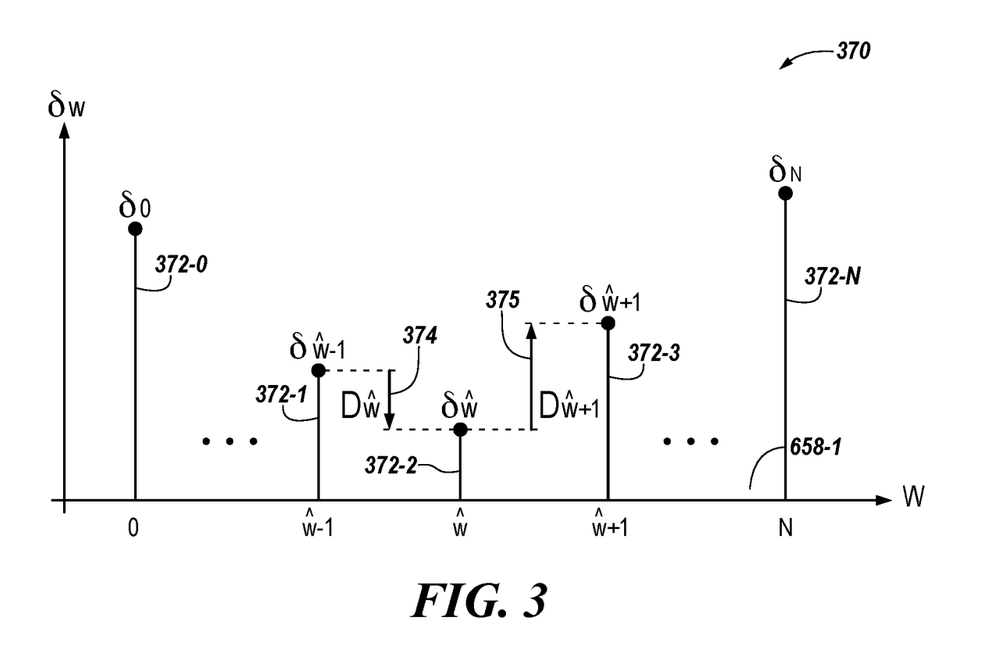
FIG. 3 is a diagram illustrating a conceptual example of cell metrics, and derivative values of the cell metrics, in accordance with an embodiment of the present disclosure.

FIG. 3 is a diagram 370 illustrating a conceptual example of cell metrics, and derivative values of the cell metrics, in accordance with an embodiment of the present disclosure. FIG. 3 illustrates the cell metrics ($\delta w$) for the memory cells of a codeword after the threshold voltage values of the memory cells have been sorted, ordered in their respective positions (w) in the sorted threshold voltage value sequence. For instance, diagram 370 illustrates the cell metric 372-0 (e.g., $\delta_0$) for the memory cell of the codeword whose threshold voltage value is in the first (e.g., $0^{th}$) position in the sorted threshold voltage value sequence, the cell metric 372-1 (e.g., $\delta \hat{w}_{-1}$) for the memory cell of the codeword whose threshold voltage value is in the $\hat{w}-1$th position in the sorted threshold voltage value sequence, the cell metric 372-2 (e.g., $\delta \hat{w}$) for the memory cell of the codeword whose threshold voltage value is in the $\hat{w}$th position in the sorted threshold voltage value sequence, the cell metric 372-3 (e.g., $\delta \hat{w}+1$) for the memory cell of the codeword whose threshold voltage value is in the $\hat{w}+1$th position in the sorted threshold voltage value sequence, and the cell metric 372-N (e.g., $\delta_N$) for the memory cell of the codeword whose threshold voltage value is in the last (e.g., Nth) position in the sorted threshold voltage value sequence.

Each cell metric 372 illustrated in FIG. 3 has a derivative (e.g., first derivative) value, which corresponds to the difference between that cell metric and the preceding cell metric. For instance, cell metric 372-2 has a derivative value 374 (e.g., $D\hat{w}$) and cell metric 372-3 has a derivative value 375 (e.g., $D\hat{w}_{+1}$). As shown in FIG. 3, derivative value 374 is negative (as represented by the downward arrow), and derivative value 375 is positive (as represented by the upward arrow). As such, cell metric 372-2 is the cell metric whose derivative value changes from negative to positive. Accordingly, cell metric 372-2 would be the cell metric input to Pearson detector 206 of FIG. 2 to determine the originally programmed data of the codeword, as previously described herein.

Figure 4:
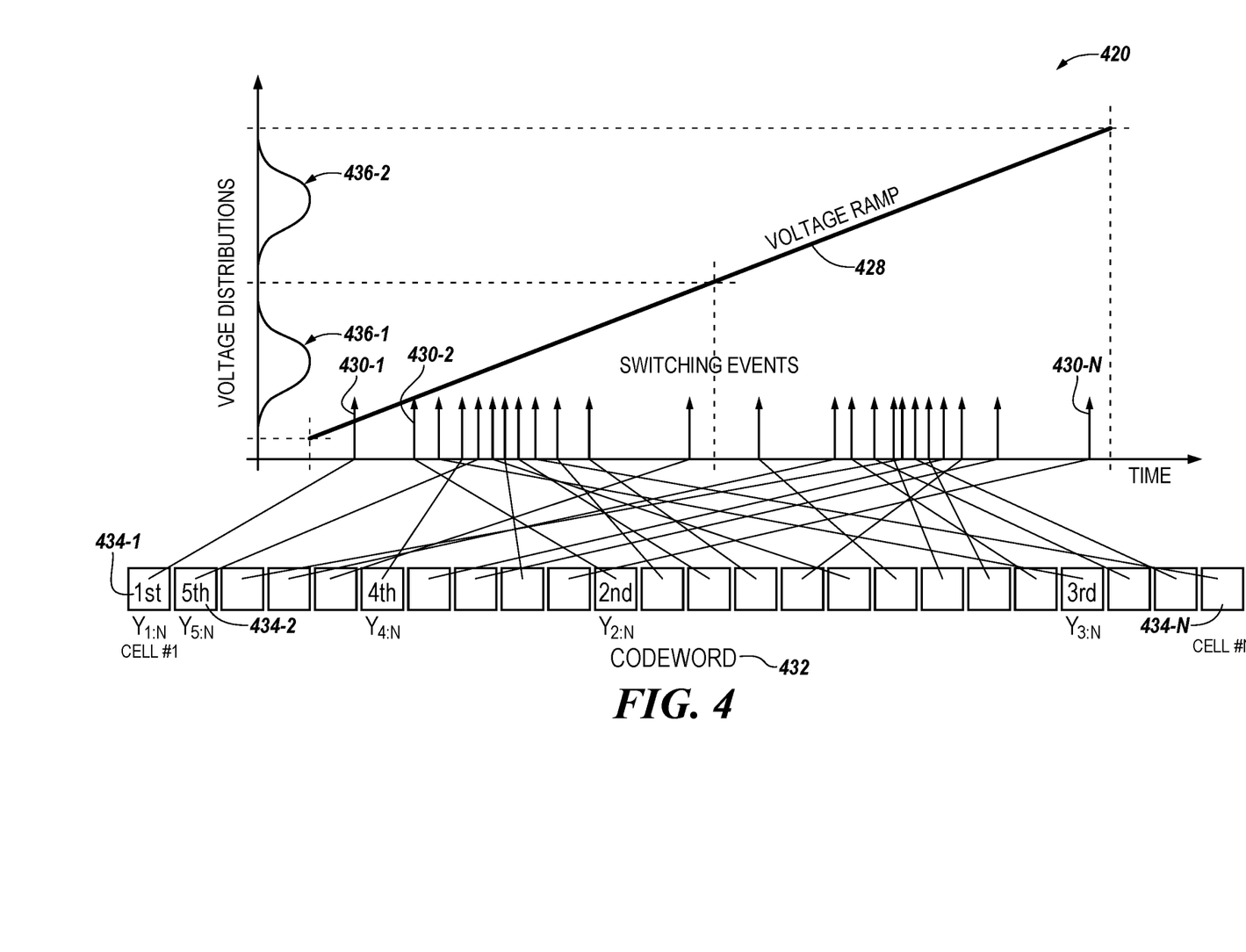
FIG. 4 is a diagram illustrating voltage distributions and corresponding data bits in a codeword in accordance with an embodiment of the present disclosure.

FIG. 4 is a diagram illustrating voltage distributions and corresponding data bits in a codeword in accordance with an embodiment of the present disclosure. FIG. 4 illustrates a diagram 420 including a ramp voltage 428, switching event times 430-1, 430-2, ..., 430-N (individually or collectively referred to as switching event times 430) of data bits 434-1, 434-2, ..., 434-N (individually or collectively referred to as data bits 434) in a codeword 432. The diagram 420 also includes voltage distributions 436-1 and 436-2.

Diagram 420 includes switching event times 430 for data bits 434 of a codeword 432 (e.g., switching event time 430-1 for data bit 434-1, switching event time 430-2 for data bit 434-2, etc.). As used herein, the term "switching event" refers to an occurrence of a memory cell changing from a low conductive state to a high conductive state, or a high conductive state to a low conductive state, in response to receiving a current that has a voltage that is greater than or equal to the threshold voltage of the memory cell. In some embodiments, applying the ramped up voltage 428 (e.g., a voltage that increases with time) to each of the memory cells can initiate a switching event in each of the memory cells at different times. For instance, in the example illustrated in FIG. 4, the memory cell of the codeword corresponding to data bit 434-1 (e.g., YIN) is the first cell to switch (at switching event time 430-1), the memory cell of the codeword corresponding to data bit $Y_{2:N}$ is the second cell to switch (at switching event time 430-2), and the memory cell of the codeword corresponding to data bit 434-2 is the fifth cell to switch. The threshold voltage value of each of the memory cells can be determined after the switching event occurs in that respective memory cell.

In some embodiments, circuitry (e.g., sorting circuitry 207 in FIG. 2) can sort the threshold voltage values of each of the memory cells in ascending order (e.g., from lowest to highest). Further, the sorted threshold voltage values can be divided into a first distribution 436-1 and second distribution 436-2, with the first distribution including the lower threshold voltage values (e.g., the cells of the codeword with the shorter switching times) and the second distribution including the higher threshold voltage values (e.g., the cells of the codeword with the longer switching times). In some embodiments, the sorted threshold voltages are divided into the first distribution 436-1 and the second distribution 436-2 such that the quantity of threshold voltage values in the first distribution 436-1 is equal to an estimated weight of the codeword 432. Further, the sorted threshold voltage values can be divided into the first distribution 436-1 and the second distribution 436-2 such that the quantity of the threshold voltage values in the second distribution 436-2 is equal to a difference between the quantity of memory cells in the codeword 432 and the quantity of the threshold voltage values in the first distribution 436-1.

First distribution 436-1 can correspond to a first data state, and second distribution 436-2 can correspond to a second data state. As an example, first distribution 436-1 can correspond to a data state of 1, and second distribution 436-2 can correspond to a data state of 0. Further, the threshold voltage values in first distribution 436-1 can be greater than a particular value, and the threshold voltage values in second distribution 436-2 can be less than that particular value. That value can be given by:

$$(N/2)(y-\mu_y+1)+\frac{1}{2}$$

where N is the total quantity of memory cells of the codeword, y is the mean of the threshold voltage values of the memory cells of the codeword, and y is the value of the voltage ramp 428.

Figure 5:
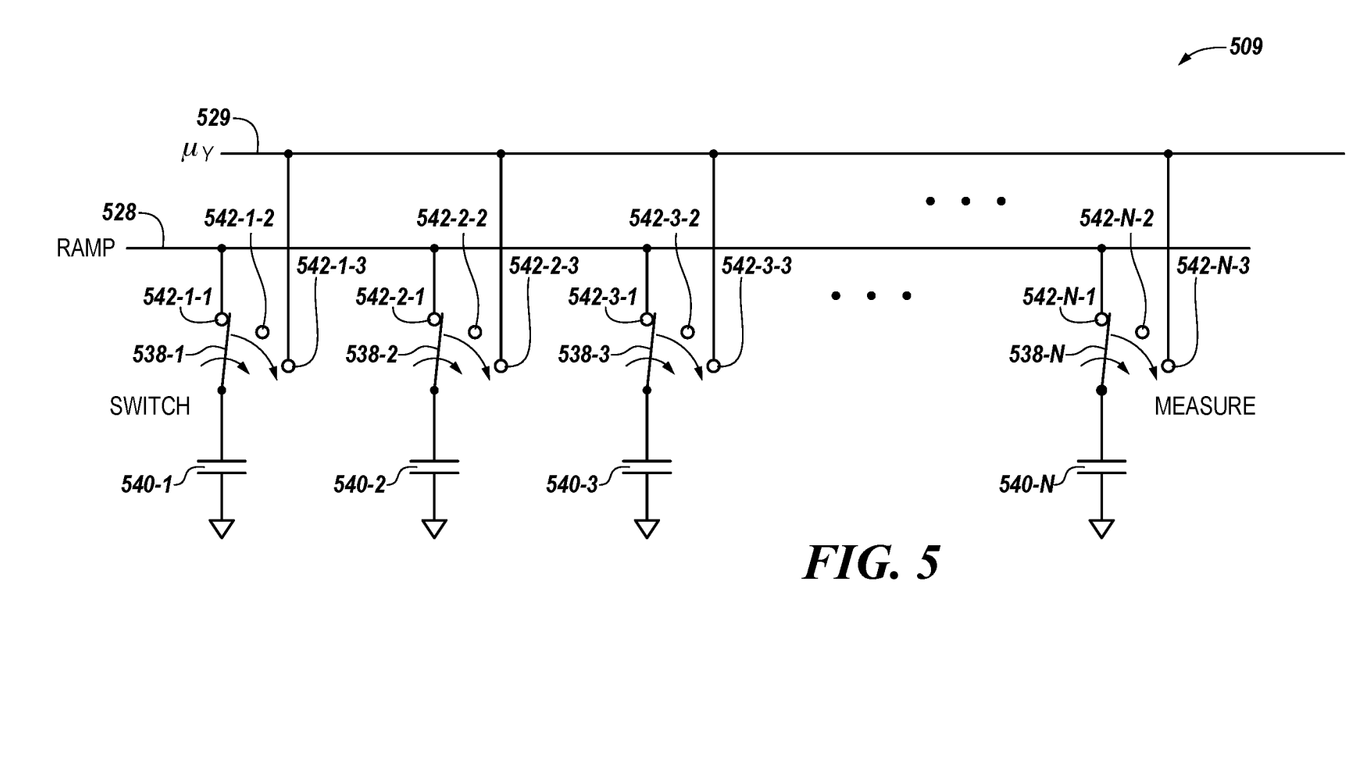
FIG. 5 illustrates circuitry for determining the mean threshold voltage value of memory cells corresponding to data bits in a codeword in accordance with an embodiment of the present disclosure.

FIG. 5 illustrates circuitry 509 for determining the mean threshold voltage value of memory cells corresponding to data bits in a codeword in accordance with an embodiment of the present disclosure. Circuitry 509 can be, for instance, circuitry 209 previously described in connection with FIG. 2. As shown in FIG. 5, circuitry 509 includes a mean voltage line 529, a ramp voltage line 528, switches 538-1, 538-2, 538-3, ..., 538-N (individually or collectively referred to as switches 538), connectors 542-1-1, 542-1-2, 542-1-3, ..., 542-N-1, 542-N-2, and 542-N-3 (individually or collectively referred to as connectors 542), and capacitors 540-1, 540-2, 540-3, ..., 540-N (individually or collectively referred to as capacitors 540).

Each respective one of the plurality of switches 538 can be configured to couple a different one of the memory cells of memory array 201 previously described in connection with FIG. 2 to a different one of a plurality of connectors 542. The ramped voltage line 528 can output a ramped voltage (e.g., ramped voltage 428 previously described in connection with FIG. 4), and each of the memory cells can be coupled to the ramped voltage via the ramp voltage line 528 when its respective switch 538 is coupled to a first connector 542-1-1, 542-2-1, 542-3-1, ..., 542-N-1 of the plurality of connectors 542 (e.g., the memory cell coupled to switch 538-1 can be coupled to ramp voltage line 528 when switch 538-1 is coupled to first connector 542-1-1, the memory cell coupled to switch 538-2 can be coupled to ramp voltage line 528 when switch 538-2 is coupled to first connector 542-2-1, etc.). In some embodiments, each of the plurality of switches 538 can be coupled to its respective first connector (e.g., to the ramp voltage line 528) until its corresponding memory cell reaches its threshold voltage. Each memory cell that is coupled to the ramp voltage line 528 may experience a switching event when it reaches its threshold voltage.

In some embodiments, each respective one of the plurality of switches 538 can be configured to decouple from the first connector 542-1-1, 542-2-1, 542-3-1, ..., 542-N-1 and couple to a second connector 542-1-2, 542-2-2, 542-3-2, ..., 542-N-2 of the plurality of connectors once its respective memory cell experiences a switching event (e.g., switch 538-1 can decouple from first connector 542-1-1 and couple to second connector 542-1-2 once the memory cell coupled to switch 538-1 experiences a switching event, switch 538-2 can decouple from first connector 542-2-1 and couple to second connector 542-2-2 once the memory cell coupled to switch 538-2 experiences a switching event, etc.). In some embodiments, the switches 538 can couple to the second connector 542-1-2, 542-2-2, 542-3-2, ..., 542-N-2 to store the voltage level of the corresponding memory cells (e.g., the threshold voltage of the cells when they experience the switching event) in capacitors 540. For example, once the memory cell that is coupled to switch 538-1 reaches its threshold voltage and experiences a switching event, switch 538-1 can decouple from the first connector 542-1-1 and couple to the second connector 542-1-2 to store the voltage of that memory cell in capacitor 540-1, while the other switches 538 can remain connected to their respective first connector.

In some embodiments, each respective one of the plurality of switches 542 can be configured to decouple form the second connector 542-1-2, 542-2-2, 542-3-2, . . . , 542-N-2 and couple to a third connector 542-1-3, 542-2-3, 542-3-3, . . . , 542-N-3 of the plurality of connectors once each (e.g., every) memory cell experiences a switching event. As shown in FIG. 5, coupling the switches 538 to the third connector 542-1-3, 542-2-3, 542-3-3, . . . , 542-N-3 couples the switches 538, and therefore the capacitors 540, to the mean voltage line 529. In some embodiments, each of the plurality of switches 538 can be configured to couple to its respective third connector 542-1-3, 542-2-3, 542-3-3, . . . , 542-N-3 simultaneously. In some embodiments, each of the memory cells can be coupled to a common node when each of the plurality of switches 538 is coupled to its respective third connector 542-1-3, 542-2-3, 542-3-3, . . . , 542-N-3.

Controller 204 and/or control circuitry 224 previously described in connection with FIG. 2 can be configured to determine the mean of the threshold voltage values of the memory cells when each of the plurality of switches 438 is coupled to its respective third connector 542-1-3, 542-2-3, 542-3-3, . . . , 542-N-3. The controller and/or control circuitry can determine the mean of the threshold voltage values of the memory cells by measuring the total voltage value stored by the capacitors 540 coupled to the mean voltage line 529 and dividing that value by the number of memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
  a memory device, wherein the memory device includes:
    an array of memory cells; and
    circuitry configured to:
      sense a codeword stored in the array of memory cells;
      determine a derivative value of a cell metric for each memory cell of the sensed codeword, wherein the derivative value of the cell metric for each respective memory cell is determined based on:
        a threshold voltage value of that respective memory cell;
        a mean of threshold voltage values of each memory cell of the sensed codeword; and
        a value proportional to a total quantity of the memory cells of the codeword and a position of the threshold voltage value of that respective memory cell in the threshold voltage values of each memory cell of the sensed codeword;
      determine the cell metric for which the determined derivative value changes from a first polarity to a second polarity;
      input the determined cell metric to a Pearson detector; and
      determine originally programmed data of the codeword using the Pearson detector.

2. The apparatus of claim 1, wherein the first polarity is negative and the second polarity is positive.

3. The apparatus of claim 1, wherein the derivative value of the cell metric for each respective memory cell of the sensed codeword corresponds to a difference between the cell metric for that respective memory cell and the cell metric for a memory cell whose threshold voltage value immediately precedes the threshold voltage value of that respective memory cell in the threshold voltage values of each memory cell of the sensed codeword.

4. The apparatus of claim 1, wherein the determined cell metric input to the Pearson detector comprises a Pearson distance between the derivative value of the determined cell metric and a correlation between the originally programmed data of the codeword and the sensed codeword.

5. The apparatus of claim 1, wherein:
  the sensed codeword comprises a sensed data value for each memory cell of the codeword; and
  the originally programmed data of the codeword comprises a programmed data value for each memory cell of the codeword.

6. The apparatus of claim 5, wherein the circuitry is configured to add a data bit having a first data value to the sensed codeword if the sensed data value for each memory cell of the codeword comprises only a second data value.

7. A method, comprising:
  sensing a codeword stored in an array of memory cells of a memory device;
  determining, for each memory cell of the sensed codeword, a derivative value of a cell metric, wherein the derivative value of the cell metric for each respective memory cell is determined based on:
    a threshold voltage value of that respective memory cell;
    a mean of threshold voltage values of each memory cell of the sensed codeword; and
    a value proportional to a total quantity of the memory cells of the codeword and a position of the threshold voltage value of that respective memory cell in the threshold voltage values of each memory cell of the sensed codeword;

determining the cell metric for which the determined derivative value changes from a negative value to a positive value;

inputting the determined cell metric to a Pearson detector; and determining originally programmed data of the codeword using the Pearson detector.

8. The method of claim 7, wherein the method includes determining the threshold voltage value of each respective memory cell of the sensed codeword after a switching event occurs in that respective memory cell.

9. The method of claim 8, wherein the method includes initiating the switching event in each respective memory cell by applying a ramped voltage to the memory cells of the sensed codeword.

10. The method of claim 7, wherein the method includes:
sorting the threshold voltage values of the memory cells of the sensed codeword; and
dividing the sorted threshold voltage values into a first distribution and a second distribution.

11. The method of claim 10, wherein:
the first distribution corresponds to a first data state; and
the second distribution corresponds to a second data state.

12. The method of claim 10, wherein:
the threshold voltage values in the first distribution are greater than a particular value; and
the threshold voltage values in the second distribution are less than the particular value.

13. An apparatus comprising:
a memory device having an array of memory cells; and
a controller coupled to the memory device and configured to:
determine, for each memory cell of a sensed codeword in the memory device, a derivative value of a cell metric for each memory cell of the sensed codeword, wherein the derivative value of the cell metric for each respective memory cell is determined based on:
a threshold voltage value of that respective memory cell;
a mean of threshold voltage values of each memory cell of the sensed codeword; and
a value proportional to a total quantity of the memory cells of the codeword and a position of the threshold voltage value of that respective memory cell in the threshold voltage values of each memory cell of the sensed codeword;
determine the cell metric for which the determined derivative value changes from a first polarity to a second polarity; and
use the determined cell metric as an input to a Pearson detector to determine an original codeword for the sensed codeword.

14. The apparatus of claim 13, wherein the controller is configured to:
determine the mean of the threshold voltage values of each memory cell of the sensed codeword by performing a first sense operation; and
determine the derivative value of the cell metric for each memory cell of the sensed codeword by performing a second sense operation.

15. The apparatus of claim 14, wherein the first sense operation and the second sense operation are different types of sense operations.

16. The apparatus of claim 14, wherein the array of memory cells comprises an array of NAND flash memory cells.

17. The apparatus of claim 13, wherein the controller is configured to determine the derivative value of the cell metric for each memory cell of the sense codeword by performing a single sense operation.

18. The apparatus of claim 17, wherein the controller is configured to:
determine the threshold voltage values of each memory cell of the sensed codeword by performing the single sense operation; and
use the threshold voltage values determined by performing the single sense operation to determine the mean of the threshold voltage values of each memory cell of the sensed codeword and the derivative value of the cell metric for each memory cell of the sensed codeword.

19. The apparatus of claim 17, wherein the array of memory cells comprises an array of self-selecting memory cells in which a single material serves as a select element and a storage element.

20. A method, comprising:
determining, by a controller coupled to a memory device, for each memory cell of a sensed codeword in the memory device, a derivative value of a cell metric for each memory cell of the sensed codeword, wherein the derivative value of the cell metric for each respective memory cell is determined based on:
a threshold voltage value of that respective memory cell;
a mean of threshold voltage values of each memory cell of the sensed codeword; and
a value proportional to a total quantity of the memory cells of the codeword and a position of the threshold voltage value of that respective memory cell in the threshold voltage values of each memory cell of the sensed codeword;
determining, by the controller, the cell metric for which the determined derivative value changes from a negative value to a positive value; and
determining, by a Pearson detector on the memory device, an original codeword for the sensed codeword using the determined cell metric.

21. The method of claim 20, wherein the Pearson detector determines the original codeword by searching for a codeword that has a lowest Pearson distance from the original codeword relative to other codewords.

22. The method of claim 21, wherein the method includes determining, by the Pearson detector, the lowest Pearson distance using a weight estimator.

23. The method of claim 20, wherein the method includes programming the determined original codeword to the memory device.

24. The method of claim 20, wherein the value proportional to the total quantity of the memory cells of the codeword and the position of the threshold voltage value of that respective memory cell in the threshold voltage values of each memory cell of the sensed codeword is given by:

$$(N+1-2w)/N$$

wherein N is the total quantity of the memory cells of the codeword and w is the position of the threshold voltage value of that respective memory cell in the threshold voltage values of each memory cell of the sensed codeword.

25. The method of claim 20, wherein the method includes determining the value proportional to the total quantity of the memory cells of the codeword and the position of the threshold voltage value of that respective memory cell in the threshold voltage values of each memory cell of the sensed codeword using a look up table.

\* \* \* \* \*